United States Patent
Chen et al.

(10) Patent No.: US 8,871,596 B2
(45) Date of Patent: Oct. 28, 2014

(54) METHOD OF MULTIPLE PATTERNING TO FORM SEMICONDUCTOR DEVICES

(75) Inventors: Kuang-Jung Chen, Poughkeepsie, NY (US); Kangguo Cheng, Schenectady, NY (US); Bruce B. Doris, Brewster, NY (US); Steven J. Holmes, Guilderland, NY (US); Sen Liu, Highland Park, NJ (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 13/555,240

(22) Filed: Jul. 23, 2012

(65) Prior Publication Data

US 2014/0024191 A1    Jan. 23, 2014

(51) Int. Cl.
*H01L 21/31* (2006.01)

(52) U.S. Cl.
USPC ............................ 438/294; 438/703; 438/704

(58) Field of Classification Search
USPC .............. 257/24, 14, 213; 438/294, 197, 703, 438/702
See application file for complete search history.

(56) References Cited

U.S. PATENT DOCUMENTS

| | | | |
|---|---|---|---|
| 5,134,085 A * | 7/1992 | Gilgen et al. | 438/210 |
| 5,288,660 A | 2/1994 | Hua et al. | |
| 5,895,240 A | 4/1999 | Chuang et al. | |
| 5,972,745 A | 10/1999 | Kalter et al. | |
| 5,989,788 A | 11/1999 | Bae et al. | |
| 6,194,318 B1 | 2/2001 | Ikeda | |
| 7,399,581 B2 * | 7/2008 | Allen et al. | 430/325 |
| 7,629,087 B2 * | 12/2009 | Huh et al. | 430/5 |
| 7,749,915 B2 * | 7/2010 | Drechsler et al. | 438/725 |
| 7,804,148 B2 * | 9/2010 | Hsu et al. | 257/435 |
| 7,989,341 B2 | 8/2011 | Tseng et al. | |
| 7,998,640 B2 | 8/2011 | Li et al. | |
| 8,008,138 B2 * | 8/2011 | Cheng et al. | 438/157 |
| 8,043,794 B2 | 10/2011 | Noelscher et al. | |
| 2002/0179997 A1 | 12/2002 | Goth et al. | |
| 2004/0157164 A1 | 8/2004 | Hasegawa et al. | |
| 2005/0221231 A1 | 10/2005 | Fritze et al. | |
| 2006/0281241 A1 | 12/2006 | Mathew | |
| 2008/0050853 A1 * | 2/2008 | Seo et al. | 438/30 |
| 2010/0163965 A1 * | 7/2010 | Kwon | 257/324 |
| 2011/0018060 A1 * | 1/2011 | Botula et al. | 257/347 |

OTHER PUBLICATIONS

Moritz, H, "Process for Providing Fine Lines" Feb. 6, 2005, IBM TDB, TBD 02-83 p. 4740-4741.*

(Continued)

*Primary Examiner* — Zandra Smith
*Assistant Examiner* — Damian A Hillman
(74) *Attorney, Agent, or Firm* — Schmeiser, Olsen & Watts; Parashos Kalaitzis (57) ABSTRACT

A method of forming different structures of a semiconductor device using a single mask and a hybrid photoresist. The method includes: applying a first photoresist layer on a semiconductor substrate; patterning the first photoresist layer using a photomask to form a first patterned photoresist layer; using the first patterned photoresist layer to form a first structure of a semiconductor device; removing the first patterned photoresist layer; applying a second photoresist layer on the semiconductor substrate; patterning the second photoresist layer using the photomask to form a second patterned photoresist layer; using the second patterned photoresist layer to form a second structure of a semiconductor device; removing the second patterned photoresist layer; and wherein either the first or the second photoresist layer is a hybrid photoresist layer comprising a hybrid photoresist.

23 Claims, 11 Drawing Sheets

(56) References Cited

OTHER PUBLICATIONS

Moritz, H., Process for Providing Fine Lines, IP.com No. IPCOM000045194D, Original Publication Date: Feb. 1, 1983, http://www.ip.com/pubview/IPCOM000045194D, p. 4740-4741.

Horng, CT et al., Superimposition of Photoresist Patterns, IP.com No. IPCOM000046925D, Original Publication Date: Aug. 1, 1983, http://www.ip.com/pubview/IPCOM000046925D, p. 1728.

Method for improving mask defect yield using multipass wafer exposures, IP.com No. IPCOM000022274D, IP.com Electronic Publication: Mar. 3, 2004, http://www.ip.com/pubview/IPCOM000022274D, 8 pages.

Juergen Carstens, Single Reticle Double Exposure, IP.com No. IPCOM000125702D, Original Publication Date: Jul. 10, 2005, http://www.ip.com/pubview/IPCOM000125702D, 6 pages.

Nishida et al., New Single-Mask Approach to Bubble Device Fabrication, IEEE Transactions on Magnetics, vol. MAG-19, No. 1, Jan. 1983, 0018-9464/83/0100-0002$00.75 copyright 1983 IEEE, pp. 2-6.

\* cited by examiner

METHOD OF MULTIPLE PATTERNING TO FORM SEMICONDUCTOR DEVICES

FIELD OF THE INVENTION

The present invention relates to the field of integrated circuits; more specifically, it relates to a method of fabricating semiconductor devices using multiple patterning.

BACKGROUND

As the dimensions of integrated circuit devices decrease, the limits of optical scaling of the photolithographic processes are being reached driving up the number of photomasks required as well as the cost of individual photomasks. Accordingly, there exists a need in the art to mitigate the deficiencies and limitations described hereinabove.

SUMMARY

A first aspect of the present invention is a method, comprising: applying a first photoresist layer on a semiconductor substrate; patterning the first photoresist layer using a photomask to form a first patterned photoresist layer; using the first patterned photoresist layer to form a first structure of a semiconductor device; removing the first patterned photoresist layer; applying a second photoresist layer on the semiconductor substrate; patterning the second photoresist layer using the photomask to form a second patterned photoresist layer; using the second patterned photoresist layer to form a second structure of a semiconductor device; removing the second patterned photoresist layer; and wherein either the first or the second photoresist layer is a hybrid photoresist layer comprising a hybrid photoresist.

A second aspect of the present invention is a method, comprising: providing a substrate comprising a buried dielectric layer between a semiconductor upper layer and a semiconductor base layer; forming first trenches in the substrate, the first trenches extending from a top surface of the upper layer, through the upper layer and into, but not through the buried dielectric layer; applying a hybrid first photoresist layer over the upper layer, the first photoresist layer comprising a hybrid photoresist; patterning the first photoresist layer using a photomask to form a first patterned photoresist layer; using the first patterned photoresist layer to form second trenches in the substrate, the second trenches extending from a top surface of the upper layer, through the upper layer, through the buried dielectric layer and into, but not through the base layer; removing the first patterned photoresist layer; filling the first and second trenches with dielectric material; applying a second photoresist layer on the semiconductor substrate, the second photoresist layer comprising either a positive tone or negative tone photoresist; patterning the second photoresist layer using the photomask to form a second patterned photoresist layer; performing an ion implantation to form a doped well in the base layer, the doped well not extending as far into the base layer as the deep trench isolation; and removing the second patterned photoresist layer.

A third aspect of the present invention is a method, comprising: providing a substrate comprising a buried dielectric layer between a semiconductor upper layer and a semiconductor base layer; forming first dielectric isolation in the substrate, the first dielectric isolation extending from a top surface of the upper layer, through the upper layer and into, but not through the buried dielectric layer; forming second dielectric isolation in the substrate, the second dielectric isolation extending from a top surface of the upper layer, through the upper layer, through the buried dielectric layer and into, but not through the base layer; forming a gate dielectric layer on the upper layer and the first and second trench isolation; applying a hybrid first photoresist layer over the upper layer, the first photoresist layer comprising a hybrid photoresist; patterning the first photoresist layer using a photomask to form a first patterned photoresist layer; using the first patterned photoresist layer to form trenches in the gate dielectric layer, the trenches in the gate dielectric layer extending through the gate dielectric layer, top surfaces of the second trench isolation exposed in the bottom of the trenches; removing the first patterned photoresist layer; forming gate electrodes on the gate dielectric layer; applying a second photoresist layer on the semiconductor substrate, the second photoresist layer comprising either a positive tone or negative tone photoresist; patterning the second photoresist layer using the photomask to form a second patterned photoresist layer; performing an ion implantation to form doped halo regions of field effect transistors in regions of the upper layer; and removing the second patterned photoresist layer.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

The embodiments of the present invention uses a single photomask to pattern at a first photoresist layer which is used to define a first structure of a semiconductor and after removal of the first photoresist layer, the same photomask is used to pattern at a second photoresist layer which is used to define a second structure of the semiconductor device. The same photomask may be used to pattern additional photoresist layers. At least one of the photoresist layers comprises a hybrid photoresist and at least one of the photoresist layers comprises a positive or negative tone photoresist. In one example, the single photomask is aligned to the same alignment targets on the substrate that the semiconductor device is being fabricated on for the patterning of at least two of photoresist layers.

Figure 1A:
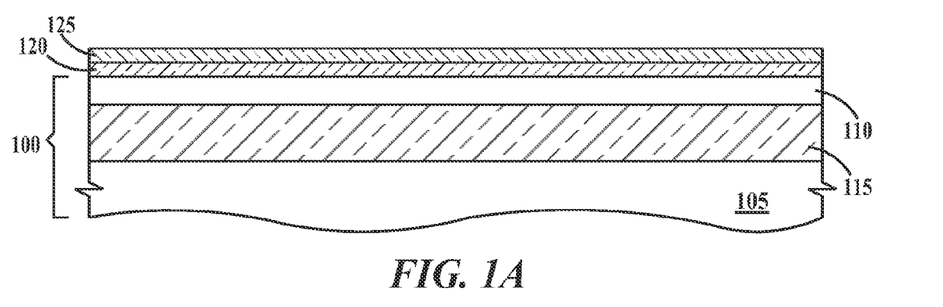
FIGS. 1A through 1H are cross-sectional drawings illustrating forming deep trench isolation using a photomask according to embodiments of the present invention.

FIGS. 1A through 1H are cross-sectional drawings illustrating forming deep trench isolation using a photomask according to embodiments of the present invention. In FIG. 1A, a semiconductor-on-insulator (SOI) substrate 100 includes a base layer 105 and an upper layer 110 separated by a buried dielectric layer 115. Formed on a top surface of upper layer 110 is a pad oxide layer 120 and formed on a top surface of the pad oxide layer is a pad nitride layer 125. Alternatively, substrate 100 may be a bulk silicon substrate (without upper layer 110 and dielectric layer 115) and pad oxide layer 120 is formed on the top surface of base layer 105. In one example, base layer 105 is single-crystal silicon. In one example, upper layer 110 is single-crystal silicon. In one example, dielectric layer 115 is oxide and is known as BOX. In one example, buried dielectric layer 115 is less than or equal to about 25 nm. In one example, upper layer 110 is between about 4 nm and about 6 nm.

Figure 1B:
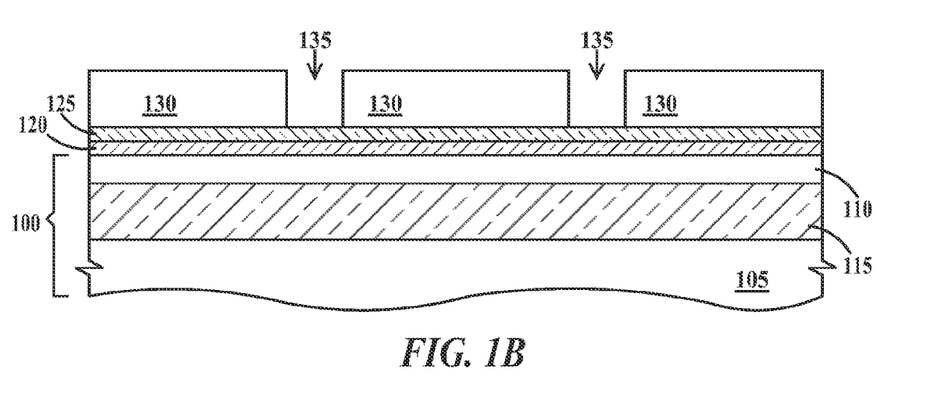

In FIG. 1B a patterned photoresist layer 130 is formed on the top surface of pad nitride layer 125 by standard photolithography by exposing an unexposed photoresist layer to actinic radiation through a photomask and developing the exposed photoresist layer. After developing the exposed photoresist, regions of the top surface of pad nitride are exposed in openings 135.

Figure 1C:
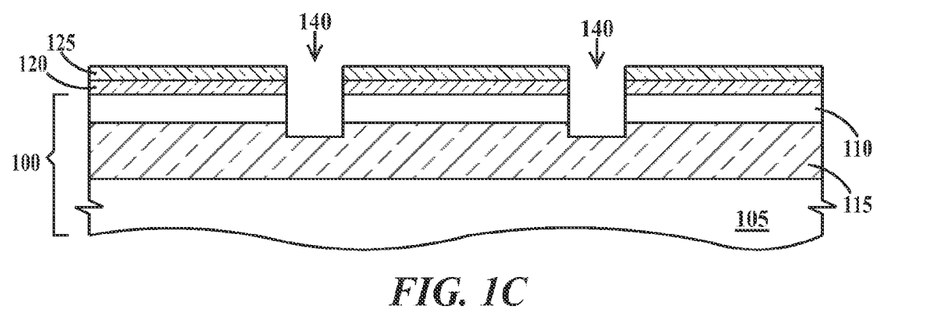

In FIG. 1C, shallow trenches 140 have been etched through pad nitride layer 125, pad oxide layer 120, upper layer 110 and into but not completely through dielectric isolation 115, and patterned photoresist layer 130 (see FIG. 1B) removed.

Figure 1D:
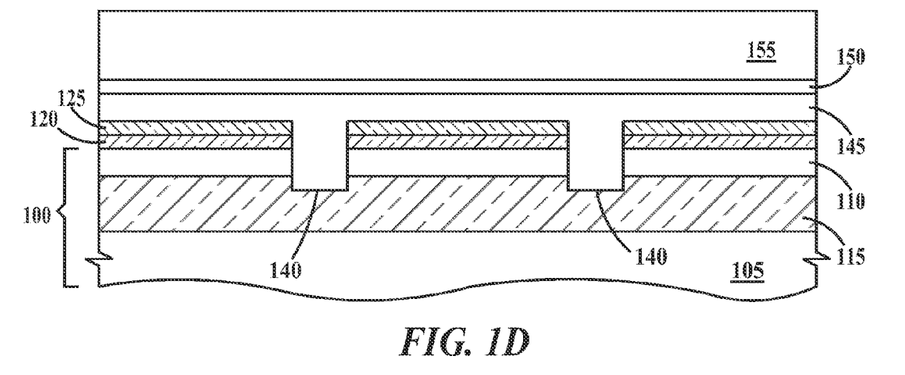

In FIG. 1D, an organic planarization layer (OPL) 145 is formed on pad nitride 125 and fills shallow trenches 140. An antireflective coating (ARC) 150 is formed on the top surface of OPL 145 and a hybrid photoresist layer 155 is formed on the top surface of ARC 150. It is necessary to the operation of the invention that photoresist layer 155 be a hybrid photoresist.

A hybrid photoresist is defined as a photoresist wherein non-exposed regions of the photoresist do not dissolve in developer or have low dissolution rates (leftmost dose range of FIG. 6C), fully exposed regions of the photoresist also do not dissolve in developer or have low dissolution rates (rightmost dose range of FIG. 6C), and partially exposed regions (central dose region of FIG. C) of the photoresist that dissolve in developer or have the highest dissolution rates. The highest solubility region being corresponding approximately to the boundary between the clear and opaque regions of the photomask (or put another way, aligned to the edges of opaque regions of the photomask) and extends part way under the clear and opaque regions. The regions of the photoresist seeing the highest dose are completely aligned under clear regions of the photomask. The regions of the photoresist seeing the lowest dose are completely aligned under an opaque region of the photomask. After developing, the patterned hybrid photoresist layer will have positive line regions corresponding to the unexposed or low dose regions, negative line regions corresponding to the exposed or high dose regions and a hybrid space region (or opening) corresponding to the boundary between exposed and unexposed regions and having a medium dose. The substrate is exposed in the hybrid space regions and hybrid space regions separate positive and negative line regions. In one example, the thickness of photoresist in the positive line regions is greater than the thickness of the photoresist in the negative line region which is greater than the thickness of the photoresist in the hybrid line region (which may be zero). The opaque photomask regions define positive lines (thick photoresist lines) in the patterned photoresist layer. The clear photomask regions define negative lines (thin photoresist lines) in the patterned photoresist layer. And the boundaries between clear regions and opaque photomask regions define hybrid spaces (openings) in the patterned photoresist later. See, for example, FIGS. 1E and 1F.

By contrast a negative tone photoresist is defined as a photoresist that is soluble before exposure to actinic radiation and becomes insoluble in a developer after exposure to actinic radiation. In one example, after exposure, the photoresist becomes less soluble (or insoluble) in developer when exposed to actinic radiation (those region of the photoresist under clear regions). The clear photomask regions define photoresist lines that are inverse or negative images relative to the opaque region of the photomask) and the clear photomask regions define spaces between the photoresist lines in the patterned photoresist layer.

By contrast a positive tone photoresist is defined as a photoresist that is insoluble before exposure to actinic radiation and becomes soluble in a developer after exposure to actinic radiation. In one example, after exposure, the photoresist becomes more soluble (or completely soluble) in developer when exposed to actinic radiation (those region of the photoresist under clear regions). The opaque photomask regions define photoresist lines that replicate opaque regions of the photomask and the clear photomask regions define spaces between the lines in the patterned photoresist layer.

Figure 1E:
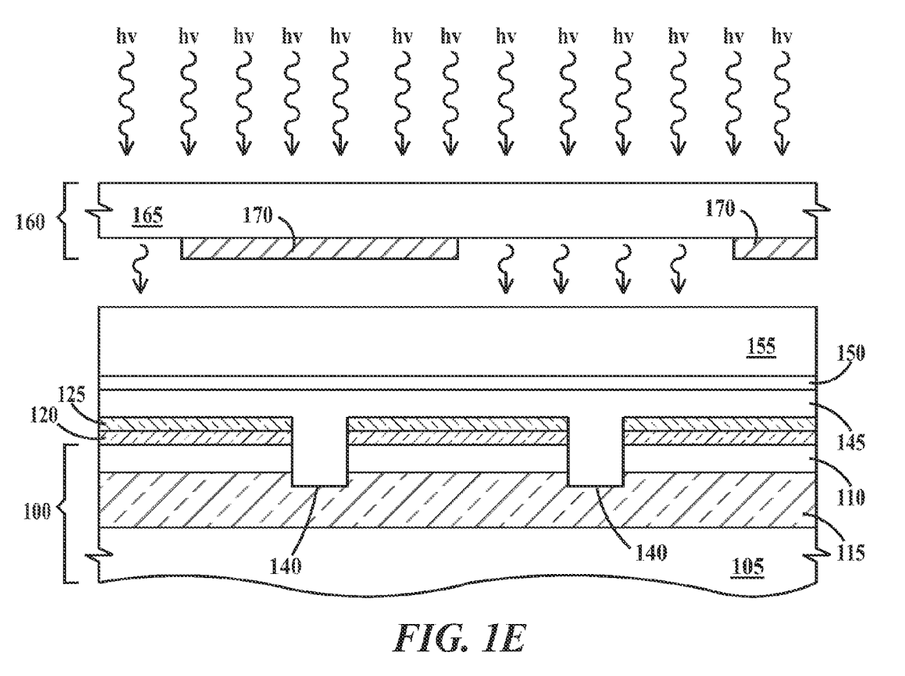

In FIG. 1E, a photomask 160 includes a transparent substrate 165 and a three-dimensional pattern of opaque lines 170. The clear regions of photomask 160 are those where there are no opaque lines. Actinic radiation hv passes through substrate 160 into photoresist layer 155 but is blocked by opaque lines 170.

Figure 1F:
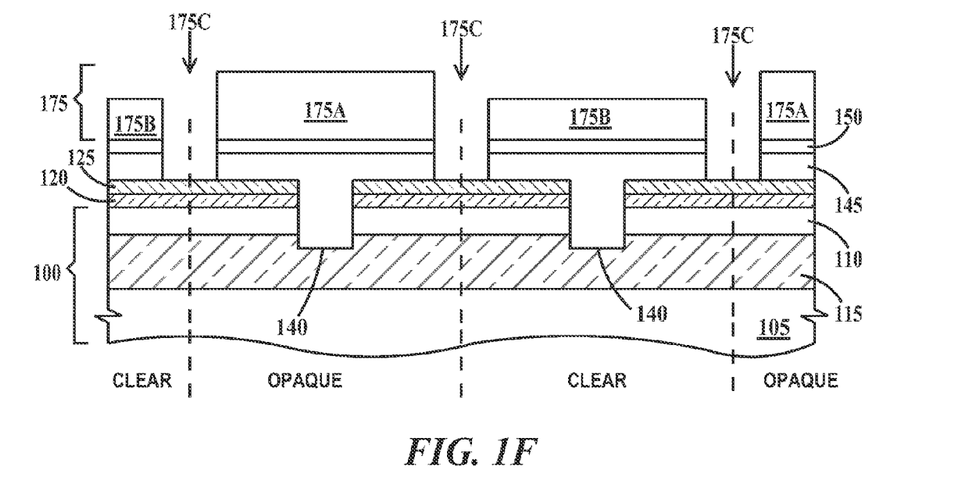

In FIG. 1F, photoresist layer 155 is developed to generate a patterned photoresist layer 175. There are three sets of regions to the pattern. Regions 175A are positive line regions and are the thickest. Regions 175B are negative line regions and are thinner than regions 175A. Regions 175C are hybrid space regions. The dashed lines indicate edges of opaque regions 170 of photomask 160 (See FIG. 1E). ARC 150 and OPL 145 are removed (e.g., by reactive ion etch (RIE)) under hybrid space regions 175C.

Figure 1G:
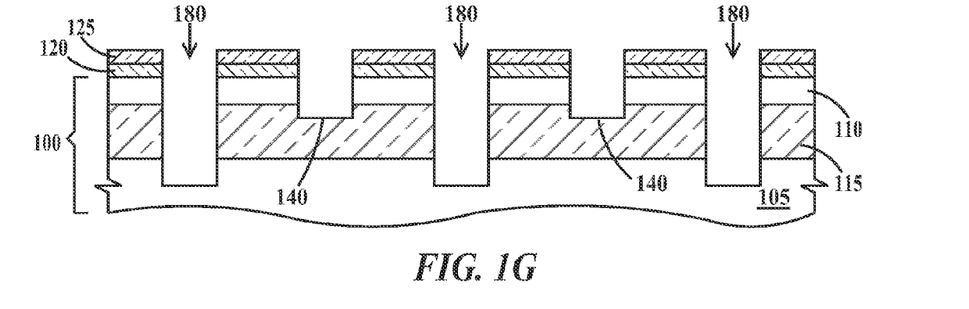

In FIG. 1G, deep trenches 180 are etched (e.g., by RIE) and patterned photoresist layer 175, ARC 150 and OPL 145 (see FIG. 1F) are removed. Deep trenches 180 extend through pad nitride 125, through pad oxide 120, through upper layer 110, through dielectric layer 115 and into, but not through base layer 105. In one example, shallow trenches 140 and deep trenches 180 are about 50 nm wide at the narrowest. In one example, deep trenches 180 are about 200 nm in depth, measured from the top surface of upper layer 110.

Figure 1H:
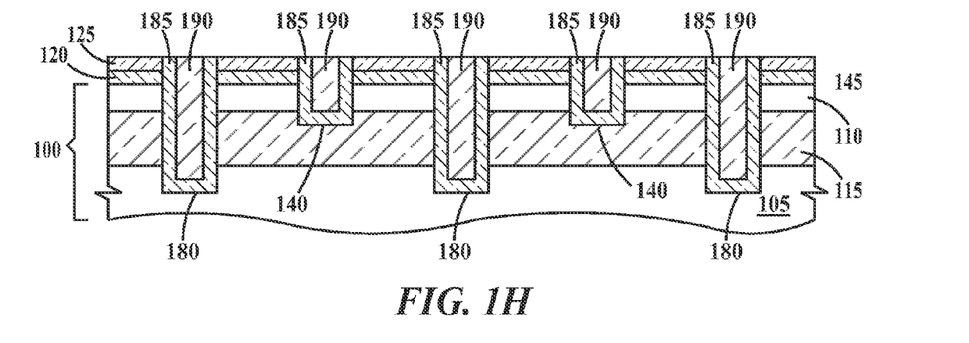

In FIG. 1H, a conformal dielectric liner 185 is formed on the sidewalls and bottoms of shallow trenches 140 and deep trenches 180 and then the remaining space in shallow trenches 140 and deep trenches 180 is filled with a dielectric material 190 to form hereinafter shallow trench isolation 140 and hereinafter deep trench isolation 180. The top surfaces of shallow trench isolation 140, deep trench isolation 180 and pad nitride 125 are coplanar (a chemical-mechanical polish (CMP) is performed after the deposition of dielectric material 190.

Figure 2A:
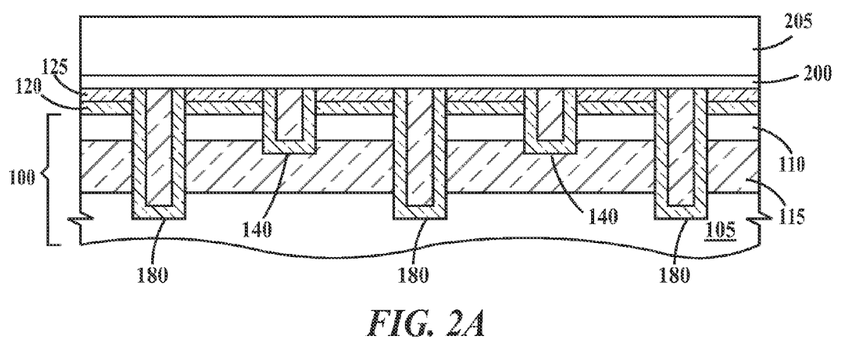
FIGS. 2A through 2E are cross-sectional drawings illustrating forming a first doped well using the same photomask used to form the trench isolation according to embodiments of the present invention.

FIGS. 2A through 2E are cross-sectional drawings illustrating forming a first doped well using the same photomask used to form the trench isolation according to embodiments of the present invention. The structure of FIG. 1H is the starting point of the method described in FIGS. 2A through 2E. In FIG. 2A, an ARC 200 is formed on the top surface of pad nitride layer 125, shallow trench isolation 140 and deep trench isolation 180. A positive tone photoresist layer 205 is formed on ARC 200.

Figure 2B:
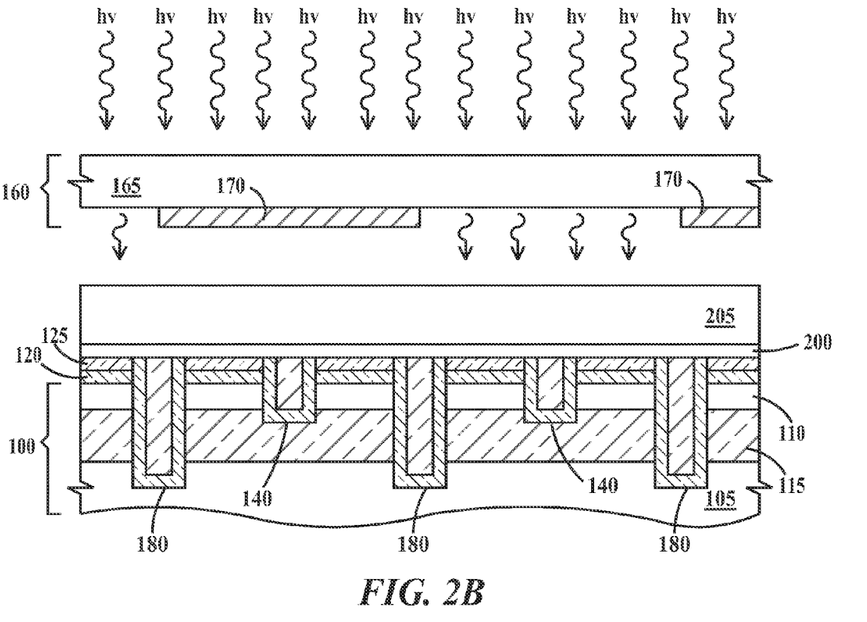
Figure 2C:
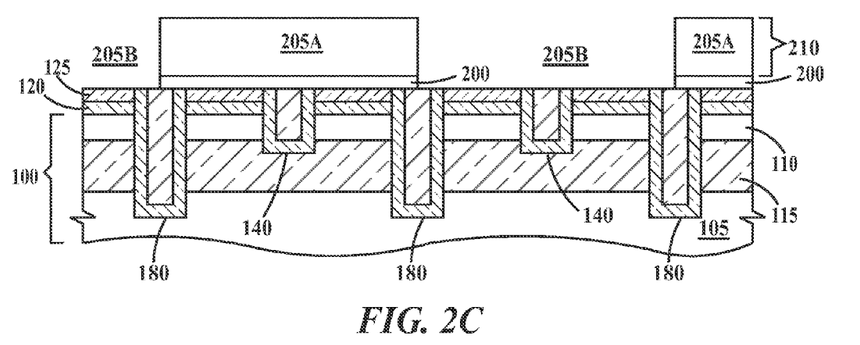

In FIG. 2B, photomask 160 (the same photomask used to define deep trenches 180) is used to selectively expose photoresist layer 205 to actinic radiation hv. In FIG. 2C, the exposed photoresist layer is developed to form a patterned photoresist layer 210 of photoresist islands 205A and spaces 205B between the photoresist islands. ARC 200 is removed in spaces 205B. The edges of photoresist islands 205A align over deep trenches 180.

Figure 2D:
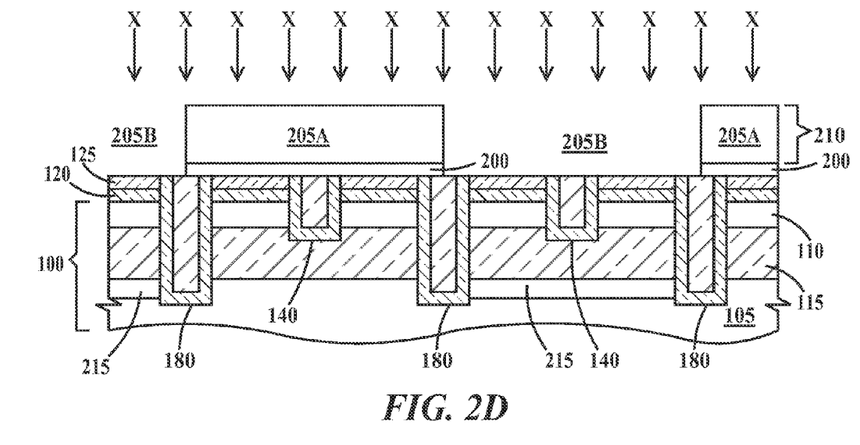
Figure 2E:
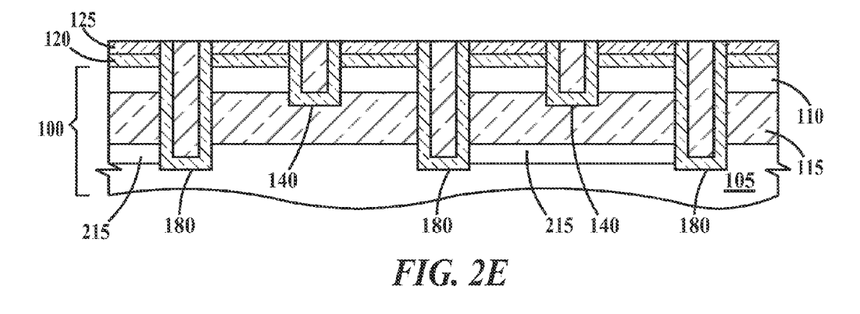

In FIG. 2D, an ion implantation of a dopant species X is performed to form first doped wells 215 in substrate 100 where the substrate is not protected by photoresist islands 205A. Doped wells 215 extend into base later 105 under dielectric layer 115 to a depth no greater than the depth that deep trench isolation 180 extends into base layer 105. When dopant species X is N type (e.g., As or P), then doped wells 215 are N-wells. In FIG. 2E, patterned photoresist layer 210 and ARC 200 are removed. Thus, both deep trench isolation 180 and doped wells 215 have been defined by the same photomask.

Figure 3A:
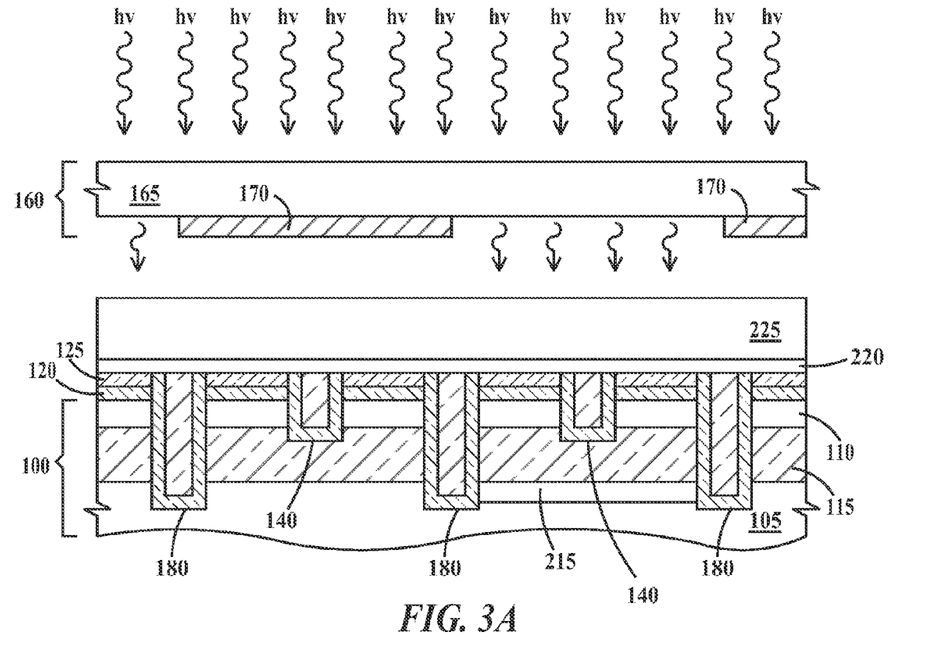
FIGS. 3A through 3C are cross-sectional drawings illustrating forming a second doped well using the same photomask used to form the trench isolation and first doped well according to embodiments of the present invention.
Figure 3B:
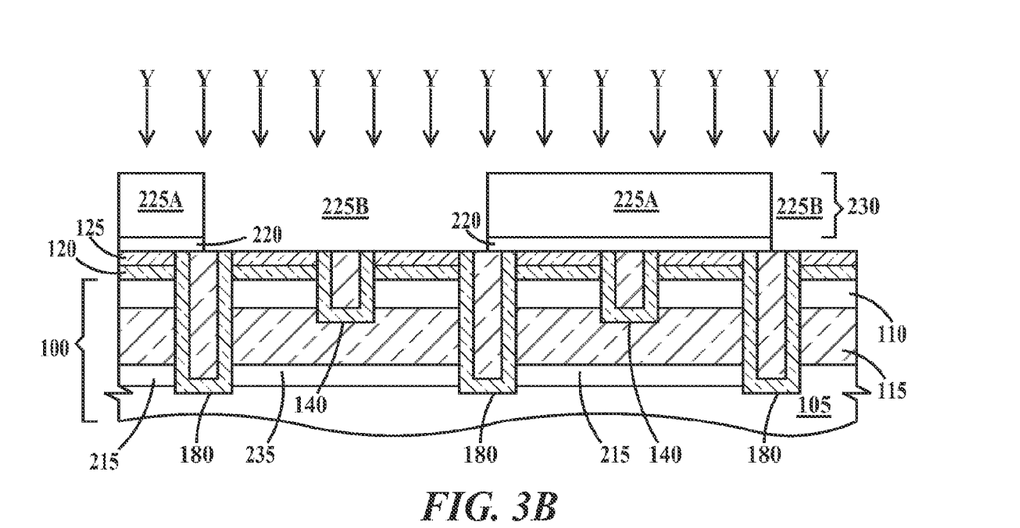
Figure 3C:
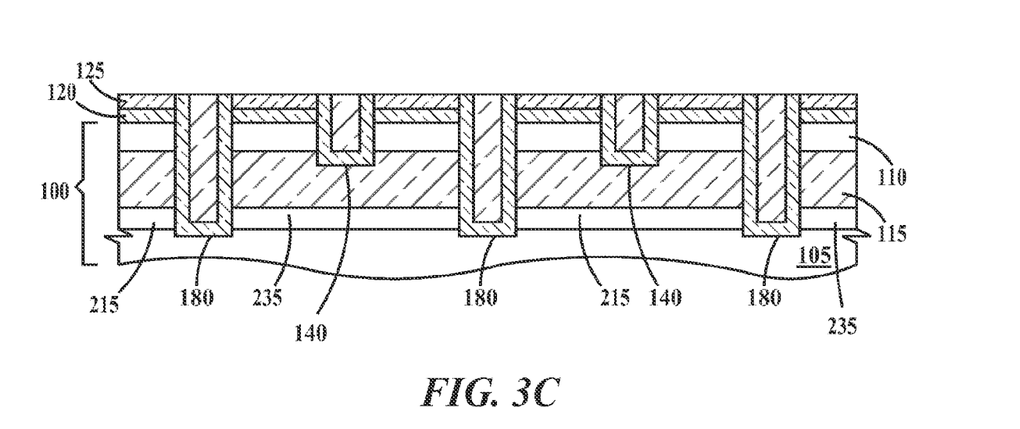

FIGS. 3A through 3C are cross-sectional drawings illustrating forming a second doped well using the same photomask used to form the trench isolation and first doped well according to embodiments of the present invention. The structure of FIG. 2E is the starting point of the method described in FIGS. 3A through 3C. In FIG. 3A, an ARC 220 is formed on the top surface of pad nitride layer 125, shallow trench isolation 140 and deep trench isolation 180. A negative tone photoresist layer 225 is formed on ARC 220. Photomask 160 (the same photomask used to define deep trenches 180 and doped well 215) is used to selectively expose photoresist layer 225 to actinic radiation hv.

In FIG. 3B, the exposed photoresist layer is developed to form a patterned photoresist layer 230 of photoresist islands 225A and spaces 225B between the photoresist islands. ARC 220 is removed in spaces 225B. The edges of photoresist islands 225A align over deep trenches 180. An ion implantation of a dopant species Y is performed to form second doped wells 235 in substrate 100 where the substrate is not protected by photoresist islands 225A. Doped wells 235 extend into base layer 105 under dielectric layer 115 to a depth no greater than the depth that deep trench isolation 180 extends into base layer 105. When dopant species Y is P type (e.g., B), then doped wells 235 are P-wells. In FIG. 3C, patterned photoresist layer 230 and ARC 220 are removed. Thus, deep trench isolation 180, doped wells 215 and doped wells 235 have been defined by the same photomask.

Figure 4A:
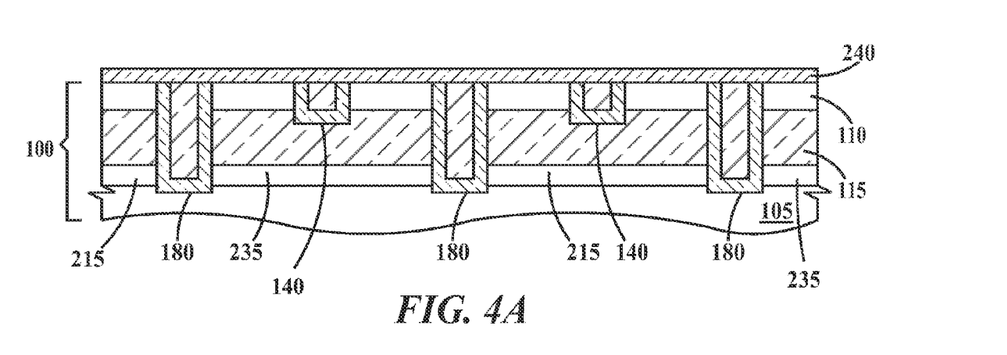
FIGS. 4A through 4D are cross-sectional drawings illustrating performing a gate dielectric cut using a photomask according to embodiments of the present invention.

FIGS. 4A through 4D are cross-sectional drawings illustrating performing a gate dielectric cut using a photomask according to embodiments of the present invention. The structure of FIG. 3C with pad oxide layer 120 and pad nitride layer 125 removed (e.g., by CMP) is the starting point of the method described in FIGS. 4A through 4D. In FIG. 4A, a gate dielectric layer 240 is formed on the coplanar (by CMP) top surfaces of upper layer 110, shallow trench isolation 140 and deep trench isolation 180. In one example, gate dielectric layer 240 is a high K (dielectric constant) material, examples of which include but are not limited metal oxides such as $Ta_2O_5$, $BaTiO_3$, $HfO_2$, $ZrO_2$, $Al_2O_3$, or metal silicates such as $HfSi_xO_y$, or $HfSi_xO_yN_z$ or combinations of layers thereof. A high K dielectric material has a relative permittivity above about 10. In one example, gate dielectric layer 240 is about 0.5 nm to 20 nm thick.

Figure 4B:
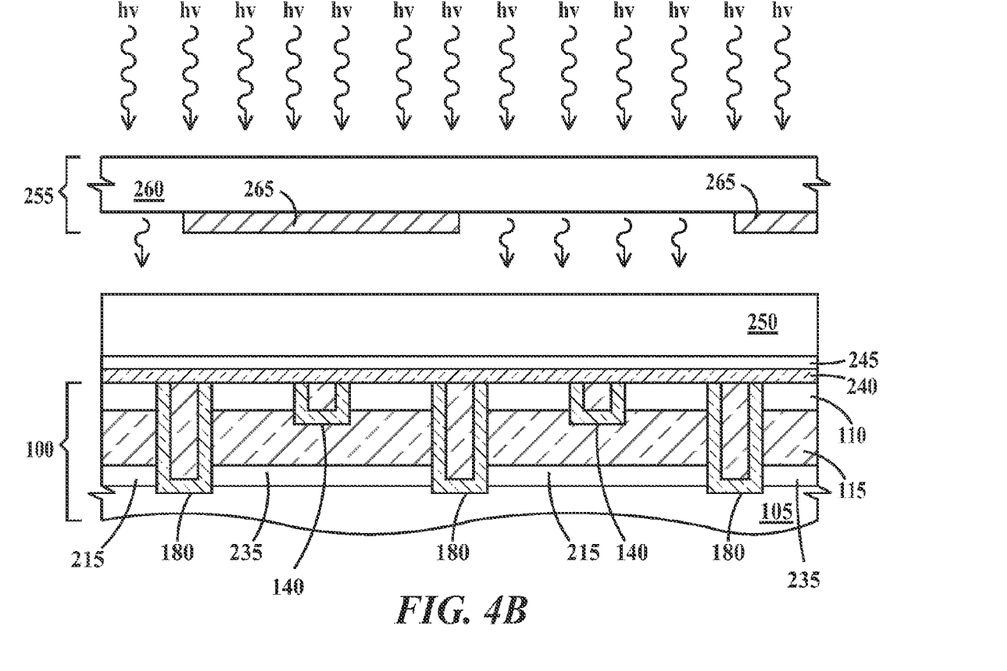

In FIG. 4B, an ARC 245 is formed on the top surface of gate dielectric layer 240 and a hybrid photoresist layer 250 is formed on the top surface of ARC 245. It is necessary to the operation of the invention that photoresist layer 250 be a hybrid photoresist. A photomask 255 includes a transparent substrate 260 and a three-dimensional pattern of opaque lines 165. The clear regions of photomask 255 are those where there are no opaque lines. Actinic radiation hv passes through substrate 260 into photoresist layer 250 but is blocked by opaque lines 265.

Figure 4C:
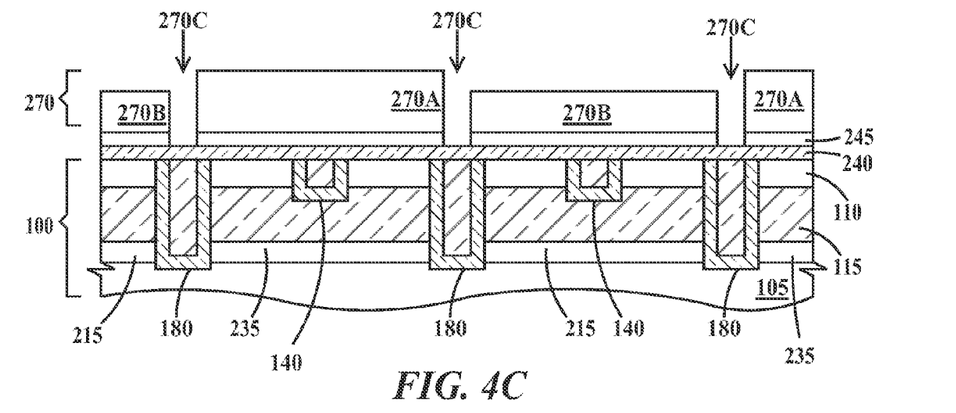

In FIG. 4C, photoresist layer 250 is developed to generate a patterned photoresist layer 270. There are three sets of regions to the pattern. Regions 270A are positive line regions and are the thickest. Regions 270B are negative line regions and are thinner than regions 270A. Regions 270C are hybrid space regions.

Figure 4D:
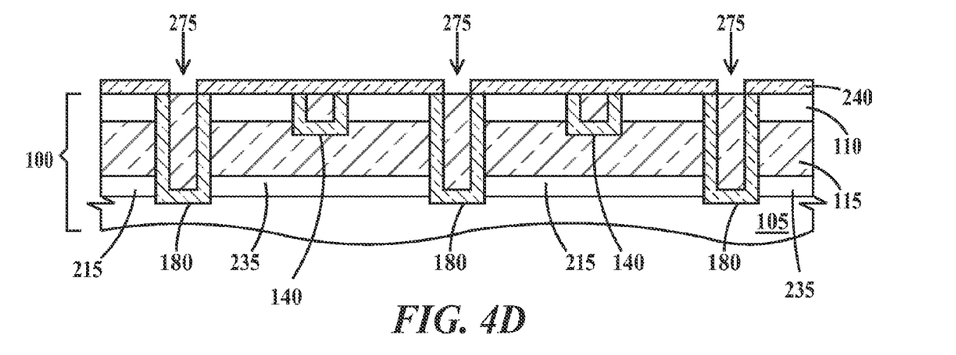

In FIG. 4D, trenches 275 are etched (e.g., by RIE) completely through gate dielectric layer 240 cutting the gate dielectric layer into islands. Trenches 275 are aligned over deep trench isolation 180. Also in FIG. 4D, patterned photoresist layer 270, and ARC 245 (see FIG. 4C) are removed.

Figure 5A:
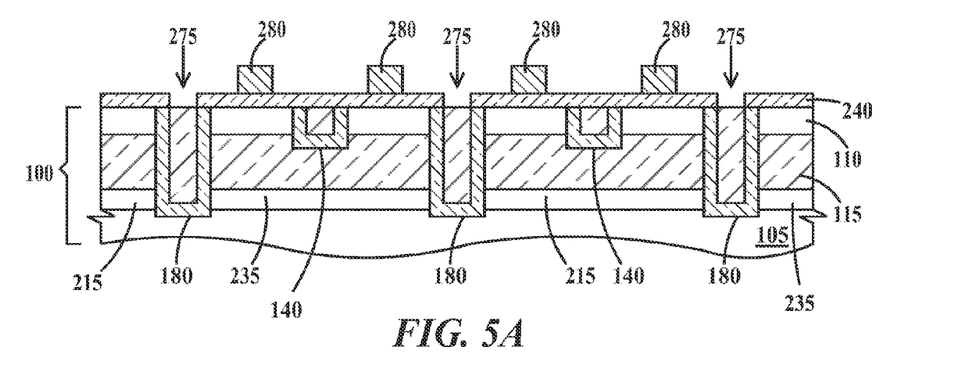
FIGS. 5A through 5E are cross-sectional drawings illustrating forming first halo regions of source/drains using the same photomask used to form the gate dielectric cut according to embodiments of the present invention.
Figure 5B:
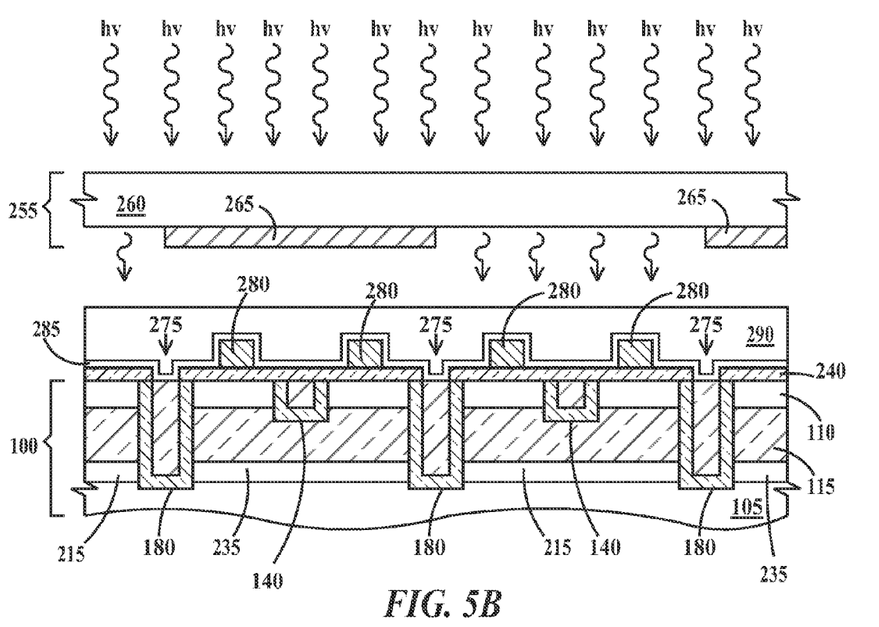

FIGS. 5A through 5D are cross-sectional drawings illustrating forming first halo regions of source/drains using the same photomask used to form the gate dielectric cut according to embodiments of the present invention. The structure of FIG. 4D is the starting point of the method described in FIGS. 5A through 5E. In FIG. 5A, gate electrodes 280 are formed on the top surface of gate dielectric layer 240 by, for example, depositing a gate electrode layer, photolithographically defining a pattern in a photoresist layer, etching (e.g., RIE) the gate electrode layer, and removing the patterned photoresist layer.

Figure 5C:
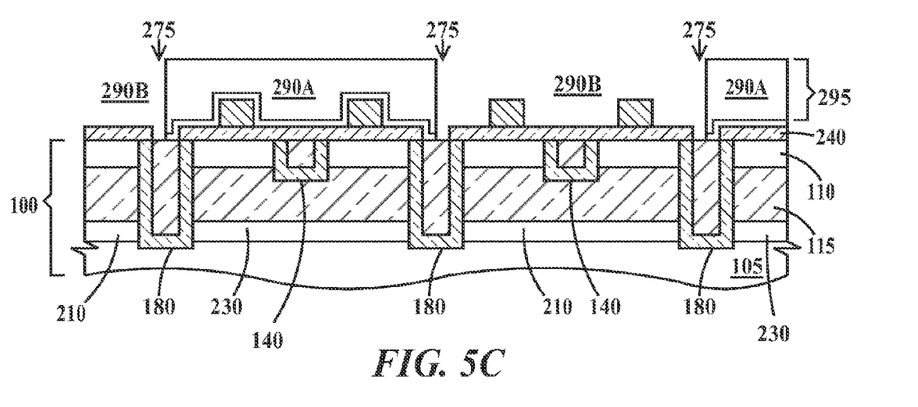

In FIG. 5A, an ARC 285 is formed on the top surface of gate dielectric layer 240, sidewalls and top surfaces of gate electrodes 280, and on the bottom and sidewalls of trenches 275. A positive tone photoresist layer 290 is formed on ARC 240. Photomask 255 (the same photomask used to define trenches 275) is used to selectively expose photoresist layer 290 to actinic radiation hv. In FIG. 5C, the exposed photoresist layer is developed to form a patterned photoresist layer 295 of photoresist islands 290A and spaces 290B between the photoresist islands. ARC 240 is removed in spaces 290B. The edges of photoresist islands 290A align over trenches 275.

Figure 5D:
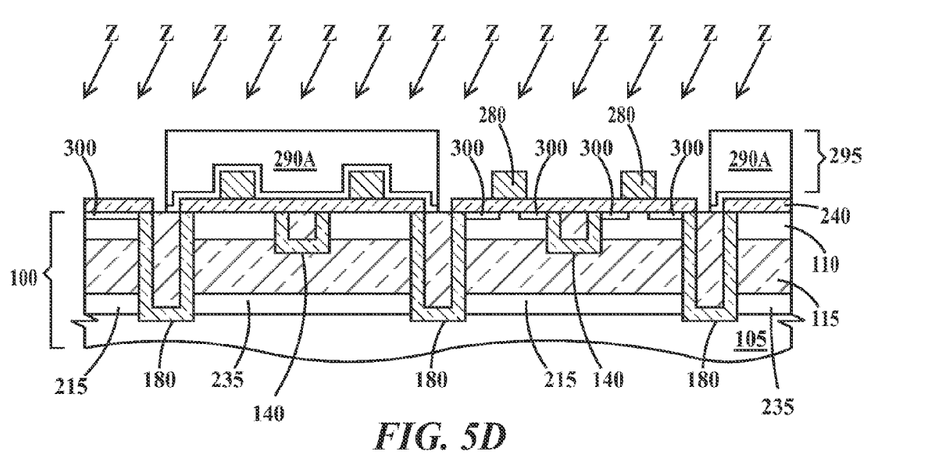
Figure 5E:
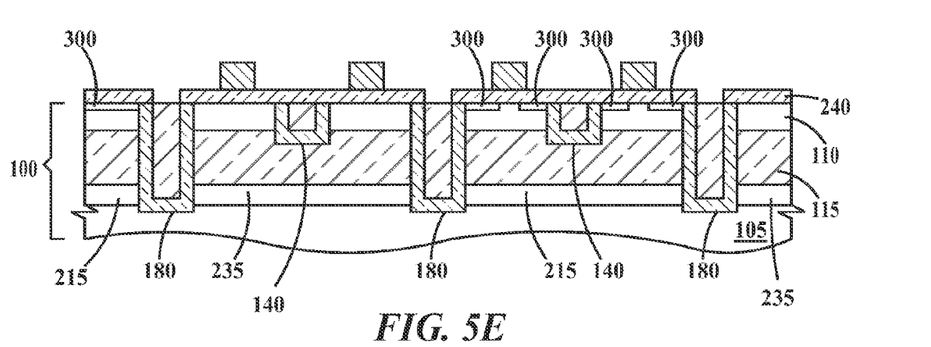

In FIG. 5D, an ion implantation of a dopant species Z is performed to form halo regions 300 in upper layer 110 where the upper layer is not protected by photoresist islands 290A. Halo ion implants are performed at an acute angle relative to the top surface of substrate 100 while rotating the substrate about an axis passing through the and perpendicular to the center of the substrate so the dopant species extends under gate electrodes 280. When dopant species Z is N type (e.g., As, P), then an NFET will be been formed (and doped well 215 is also N-type). In FIG. 5E, patterned photoresist layer 295 and ARC 285 are removed. Thus, the cuts in gate dielectric layer 240 and the halo regions 300 of source/drains 300 have been defined by the same photomask.

PFETS may be formed in the regions of upper layer 110 not containing source/drains in the same manner as NFETs were formed in FIGS. 5A-5E using the same photo mask 255, but using negative tone photoresist and implanting a P type dopant (e.g., B). Thus, the cuts in gate dielectric layer 240 and the source/drains of PFETs and NFETs can be defined by the same photomask.

Figure 6A:
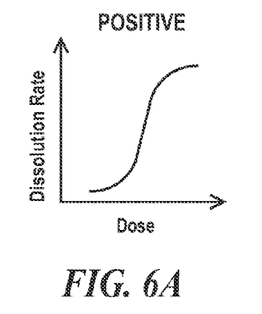
FIGS. 6A-6C are plots of dissolution rate versus exposure dose for positive tone, negative tone and hybrid photoresists.
Figure 6B:
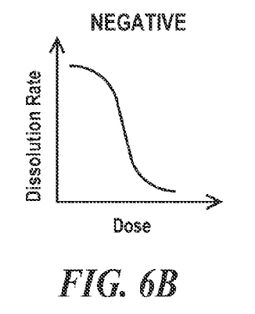
Figure 6C:
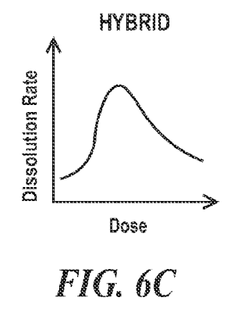

FIGS. 6A-6C are plots of dissolution rate versus exposure dose for positive tone, negative tone and hybrid photoresists. In FIG. 6A, as dose increases the dissolution rate increases. In one example, the increase in dissolution rate is due to cleavage of an acid liable moiety of the polymer. In FIG. 6B, as dose increases the dissolution rate decreases as actinic radiation causes cross-linking of the polymers of negative tone resists. In FIG. 6C, as dose increases the dissolution rate increases, reaches a peak and then decreases. In one example, a cross-linking agent is added to a positive tone photoresist to make a hybrid photoresist. In one example, a hybrid photoresist contains both a photoacid generator and a photobase generator. In either example, there are competing responses to actinic radiation that results in the curve of FIG. 6C. For example, actinic radiation may induce a first positive tone response in the photoresist causing the photoresist to become soluble in the exposed regions and induce a second negative tone response causing the photoresist to become higher in molecular weight in the exposed regions thus decreasing the solubility in the exposed regions ARC 150 of FIG. 1D, ARC 200 of FIG. 2B, ARC 220 of FIG. 3A and ARC 245 of FIG. 4B may be a single layer of an organic ARC or a dual layer of an organic ARC covered by a hardmask layer, such a layer of silicon. The silicon between the organic ARC and the photoresist layer.

Thus the embodiments of the present invention provide methods of forming different semiconductor devices structures using the same photomask.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   applying a first photoresist layer on a semiconductor substrate;
   patterning said first photoresist layer using a photomask to form a first patterned photoresist layer;
   using said first patterned photoresist layer to form a first structure of a semiconductor device;
   removing said first patterned photoresist layer;
   applying a second photoresist layer on said semiconductor substrate;
   patterning said second photoresist layer using said photomask to form a second patterned photoresist layer;
   using said second patterned photoresist layer to form a second structure of a semiconductor device;
   removing said second patterned photoresist layer; and
   wherein either said first photoresist layer is a hybrid photoresist layer comprising a hybrid photoresist and said first patterned photoresist layer comprises a first region of a first thickness, a second region of a second thickness different from said first thickness and a hybrid region where said first photoresist layer is completely removed, said first and second regions abutting and separated by said hybrid region and wherein said first structure is defined by said hybrid region in said first photoresist layer; or
   wherein said second photoresist layer is a hybrid photoresist layer said second patterned photoresist layer comprises a first region of a first thickness, a second region of a second thickness different from said first thickness and a hybrid region between said first and second regions where said second photoresist layer is completely removed, said first and second regions abutting and separated by said hybrid region and wherein said second structure is defined by said hybrid region in said second photoresist layer.

2. The method of claim 1, wherein (i) when said first photoresist layer is said hybrid photoresist layer said second photoresist layer comprises a positive or negative tone photoresist or (ii) when said second photoresist layer is said hybrid photoresist layer said first photoresist layer comprises a positive or negative tone photoresist.

3. The method of claim 1, wherein said hybrid photoresist layer forms three regions of different dissolution rate in a developer after exposure to actinic radiation through said photomask, said photomask having clear regions and opaque regions; and
   after said exposure to actinic radiation, (i) a highest dissolution rate region of said hybrid photoresist layer of is a region of said hybrid photoresist layer that is aligned to the boundary between said clear and opaque regions and extends part way under the clear and opaque regions, (ii) a second highest dissolution rate region is a region that is completely aligned under a clear region of the photomask and (iii) a lowest dissolution rate region is a region that is completely aligned under an opaque region of the photomask.

4. The method of claim 3, wherein said highest solubility regions intervene between said second highest and said lowest solubility regions.

5. The method of claim 1, wherein after exposing said hybrid photoresist layer to actinic radiation through said photomask and developing the exposed photoresist layer to form a patterned hybrid photoresist layer, openings in said patterned hybrid layer are formed only in regions of said patterned hybrid photoresist that were aligned to boundaries between clear and opaque regions of said photomask.

6. The method of claim 1, wherein (i) said first structure is dielectric trench isolation and said first photoresist layer is said hybrid photoresist layer and (ii) said second structure is a an N-well or a P-well and said second photoresist layer is said positive or said negative photoresist layer.

7. The method of claim 1, wherein (i) said first structure are trenches through a gate dielectric layer and said first photoresist layer is said hybrid photoresist layer and (ii) said second structure is a halo region of an N-doped source/drain or a halo region of a P-doped source/drain and said second photoresist layer is said positive or said negative photoresist layer.

8. A method, comprising:
   providing a substrate comprising a buried dielectric layer between a semiconductor upper layer and a semiconductor base layer;
   forming first trenches in said substrate using a first photomask, said first trenches extending from a top surface of said upper layer, through said upper layer and into, but not through said buried dielectric layer;
   applying a hybrid first photoresist layer over said upper layer, said first photoresist layer comprising a hybrid photoresist;
   patterning said first photoresist layer using a second photomask to form a first patterned photoresist layer;
   using said first patterned photoresist layer to form second trenches in said substrate, said second trenches extending from a top surface of said upper layer, through said upper layer, through said buried dielectric layer and into, but not through said base layer;
   removing said first patterned photoresist layer;
   simultaneously filling said first and second trenches with dielectric material;

applying a second photoresist layer on said semiconductor substrate, said second photoresist layer comprising either a positive tone or negative tone photoresist;

patterning said second photoresist layer using said second photomask to form a second patterned photoresist layer;

using said second photoresist layer as an ion-implantation mask, performing an ion implantation to form a doped well in said base layer, said doped well under and abutting said buried dielectric layer, said doped well not extending as far into said base layer as said deep trench isolation; and removing said second patterned photoresist layer.

9. The method of claim 8, further including:

applying a third photoresist layer on said semiconductor substrate, (i) said third photoresist layer comprising a negative tone when said second photoresist layer comprised a positive tone photoresist or (ii) said third photoresist layer comprising a positive tone photoresist when said first photoresist layer comprised a negative tone photoresist;

patterning said third photoresist layer using said second photomask to form a third patterned photoresist layer;

using said third photoresist layer as an ion-implantation mask, performing an additional ion implantation to form an additional doped well in said base layer, said additional doped well not extending as far into said base layer as said deep trench isolation, said additional doped well doped an opposite type from said doped well; and removing said third patterned photoresist layer.

10. The method of claim 8, further including:

before applying said hybrid second photoresist layer, applying a organic planarization layer over said substrate, said organic planarization layer filling said first trenches;

between removing said first patterned photoresist layer and filling said first and second trenches with dielectric material, completely removing said organic planarization layer, and wherein said second trenches extend completely through said organic planarization layer.

11. The method of claim 8, wherein said upper layer and said base layer comprise single-crystal silicon.

12. The method of claim 8, wherein said hybrid photoresist layer forms three regions of different dissolution rate in a developer after exposure to actinic radiation through said photomask, said photomask having clear regions and opaque regions; and after said exposure to actinic radiation, (i) a highest dissolution rate region of said hybrid photoresist layer of is a region of said hybrid photoresist layer that is aligned to the boundary between said clear and opaque regions and extends part way under the clear and opaque regions, (ii) a second highest dissolution rate region is a region that is completely aligned under a clear region of the photomask and (iii) a lowest dissolution rate region is a region that is completely aligned under an opaque region of the photomask.

13. The method of claim 12, wherein said highest solubility regions intervene between said second highest and said lowest solubility regions.

14. The method of claim 8, wherein after exposing said hybrid photoresist layer to actinic radiation through said photomask and developing the exposed photoresist layer to form a patterned hybrid photoresist layer, openings in said patterned hybrid layer are formed only in regions of said patterned hybrid photoresist that were aligned to boundaries between clear and opaque regions of said photomask.

15. A method, comprising:

providing a substrate comprising a buried dielectric layer between a semiconductor upper layer and a semiconductor base layer;

forming first dielectric isolation in said substrate, said first dielectric isolation extending from a top surface of said upper layer, through said upper layer and into, but not through said buried dielectric layer;

forming second dielectric isolation in said substrate, said second dielectric isolation extending from a top surface of said upper layer, through said upper layer, through said buried dielectric layer and into, but not through said base layer;

forming a gate dielectric layer on said upper layer and said first and second trench isolation;

applying a first photoresist layer over said upper layer, said first photoresist layer comprising a hybrid photoresist;

patterning said first photoresist layer using a photomask to form a first patterned photoresist layer;

using said first patterned photoresist layer to form trenches in said gate dielectric layer, said trenches in said gate dielectric layer extending through said gate dielectric layer, top surfaces of said second trench isolation exposed in the bottom of said trenches;

removing said first patterned photoresist layer;

forming gate electrodes on said gate dielectric layer;

applying a second photoresist layer on said semiconductor substrate, said second photoresist layer comprising either a positive tone or negative tone photoresist;

patterning said second photoresist layer using said photomask to form a second patterned photoresist layer;

using said second patterned photoresist layer as an ion implantation block mask, performing an ion implantation to form doped halo regions of field effect transistors in regions of said upper layer; and removing said second patterned photoresist layer.

16. The method of claim 15, further including:

applying a third photoresist layer on said semiconductor substrate, (i) said third photoresist layer comprising a negative tone when said second photoresist layer comprised a positive tone photoresist or (ii) said third photoresist layer comprising a positive tone photoresist when said first photoresist layer comprised a negative tone photoresist;

patterning said third photoresist layer using said photomask to form a third patterned photoresist layer;

using said third patterned photoresist layer as an ion-implantation mask, performing an additional ion implantation to form additional doped halo regions of field effect transistors in additional regions of said upper layer; and removing said third patterned photoresist layer.

17. The method of claim 15, wherein said upper layer and said base layer comprise single-crystal silicon.

18. The method of claim 15, wherein said hybrid photoresist layer forms three regions of different dissolution rate in a developer after exposure to actinic radiation through said photomask, said photomask having clear regions and opaque regions; and after said exposure to actinic radiation, (i) a highest dissolution rate region of said hybrid photoresist layer of is a region of said hybrid photoresist layer that is aligned to the boundary between said clear and opaque regions and extends part way under the clear and opaque regions, (ii) a second highest dissolution rate region is a region that is completely aligned under a clear region of the photomask and (iii) a lowest dissolution rate region is a region that is completely aligned under an opaque region of the photomask.

19. The method of claim 18, wherein said highest solubility regions intervene between said second highest and said lowest solubility regions.

20. The method of claim 15, wherein after exposing said hybrid photoresist layer to actinic radiation through said photomask and developing the exposed photoresist layer to form a patterned hybrid photoresist layer, openings in said patterned hybrid layer are formed only in regions of said patterned hybrid photoresist that were aligned to boundaries between clear and opaque regions of said photomask.

21. The method of claim 15, wherein said first patterned photoresist layer comprising first regions of a first thickness, second regions of a second thickness different from said first thickness and third regions where said first photoresist layer is completely removed, said first and second regions abutting and separated by said third regions, and wherein said third regions directly over only said second dielectric isolation.

22. The method of claim 1, wherein said photomask comprises a transparent substrate having a completely contiguous and planer surface and a three dimensional pattern of opaque lines on said surface and clear regions where there are no opaque lines.

23. The method of claim 8, wherein said first patterned photoresist layer comprises a first region of a first thickness, a second region of a second thickness different from said first thickness and a hybrid region where said first photoresist layer is completely removed, said first and second regions abutting said third region and separated by said by said hybrid region and wherein said trenches are defined by said hybrid region in said first photoresist layer.

* * * * *